United States Patent
Giust et al.

(10) Patent No.: US 7,388,440 B1
(45) Date of Patent: Jun. 17, 2008

(54) CIRCUIT AND METHOD TO SPEED UP PLL LOCK-TIME AND PROHIBIT FREQUENCY RUNAWAY

(75) Inventors: Gary Giust, Santa Clara, CA (US); Chwei-Po Chew, Cupertino, CA (US); Sung-Ki Min, Cupertino, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 11/003,996

(22) Filed: Dec. 2, 2004

Related U.S. Application Data

(60) Provisional application No. 60/527,149, filed on Dec. 5, 2003.

(51) Int. Cl.
*H03L 0/97* (2006.01)
(52) U.S. Cl. .............................. 331/17; 331/16; 327/157
(58) Field of Classification Search .................. 331/17, 331/16; 327/157
See application file for complete search history.

(56) References Cited

U.S. PATENT DOCUMENTS

| | | | |
|---|---|---|---|
| 5,384,502 A * | 1/1995 | Volk | 327/157 |
| 5,491,458 A | 2/1996 | McCune, Jr. et al. | |
| 5,651,035 A | 7/1997 | Tozun et al. | |
| 5,794,130 A * | 8/1998 | Abe et al. | 455/76 |
| 5,886,582 A | 3/1999 | Stansell | |
| 5,952,888 A | 9/1999 | Scott | |
| 6,072,345 A * | 6/2000 | Ooishi | 327/157 |
| 6,172,571 B1 | 1/2001 | Moyal et al. | |
| 6,211,741 B1 | 4/2001 | Dalmia | |
| 6,272,646 B1 | 8/2001 | Rangasayee et al. | |
| 6,307,413 B1 | 10/2001 | Dalmia et al. | |
| 6,310,521 B1 | 10/2001 | Dalmia | |
| 6,369,660 B1 | 4/2002 | Wei et al. | |
| 6,377,646 B1 | 4/2002 | Sha | |
| 6,445,211 B1 | 9/2002 | Saripella | |
| 6,466,078 B1 | 10/2002 | Stiff | |
| 6,553,057 B1 | 4/2003 | Sha et al. | |
| 6,560,306 B1 | 5/2003 | Duffy et al. | |
| 6,667,642 B1 | 12/2003 | Moyal | |
| 6,683,930 B1 | 1/2004 | Dalmia | |
| 6,690,224 B1 | 2/2004 | Moore | |
| 6,704,381 B1 | 3/2004 | Moyal et al. | |
| 6,782,068 B1 | 8/2004 | Wilson et al. | |
| 6,850,554 B1 | 2/2005 | Sha et al. | |
| 6,856,204 B2 * | 2/2005 | Kwon | 331/17 |

\* cited by examiner

*Primary Examiner*—Robert J. Pascal
*Assistant Examiner*—James Goodley

(57) ABSTRACT

A lock-aid circuit and method is applied to a phase lock loop (PLL) having a voltage controlled oscillator (VCO), wherein the lock aid is coupled with the input of the VCO. In one example, the lock aid includes a Schmitt trigger having an output, a switch having an output and an input coupled to the output of the Schmitt trigger, and a voltage controlled current source coupled with the output of the switch.

3 Claims, 3 Drawing Sheets

CIRCUIT AND METHOD TO SPEED UP PLL LOCK-TIME AND PROHIBIT FREQUENCY RUNAWAY

CROSS REFERENCE TO RELATED APPLICATION

This application claims priority under 35 U.S.C. 119(e) to U.S. Provisional Patent Application No. 60/527,149 entitled "CIRCUIT TO SPEED UP PLL LOCK-TIME AND PROHIBIT FREQUENCY RUNAWAY" filed Dec. 5, 2003, the disclosure of which is hereby incorporated by reference in its entirety.

FIELD OF THE INVENTION

This invention, in general, relates to electronic circuits, and in particular, to phase locked loop circuits.

BACKGROUND OF THE INVENTION

Phase locked loops are commonly used on various circuit applications, and may be used as clock multipliers or clock sources. For instance, an input clock of 10 MHz can be multiplied by a phase locked loop to yield a signal at 1 GHz, preferably in phase alignment with the 10 MHz clock signal.

In electronic systems, good clock distribution is very important to the overall performance of the product. Unwanted clock skew and jitter are two phenomena that may result from poor clock distribution, thus causing problems in the design and operation of the electronic systems. Techniques have been developed using phase locked loops (PLLs) to successfully manage these problems and reduce both to manageable levels, and PLLs are widely used in electronic circuits.

Conventional phase lock loops are discussed in many publications, examples of which include "PLL Synthesizers: A Switching Speed Tutorial", Bar-Giora Goldberg, Microwave Journal, September 2001, see http://www.peregrine-semi.com/pdf_pll_switching_speed_giora.pdf. Further examples include Robert Adler, "A Study of Locking Phenomena in Oscillators" Proceedings of the IEEE, October 1973, pp. 1380-1385; Roland Best, "Phase Lock Loops", McGraw-Hill, New York, 1984; and "Electronic Circuits Design and Applications", U. Tietze, Ch. Schenk, Springer-Verlag (1991) pp. 164-167.

A typical phase locked loop circuit is shown in FIG. 1, having a phase/frequency detector, a charge pump, a filter, a voltage controlled oscillator (VCO) or variable frequency oscillator (VFO), and a divider (shown to divide by N). The phase/frequency detector sends to the filter information about the frequency and phase of the reference signal relative to the feedback clock signal. The filter integrates this information into a voltage. The VCO converts the voltage information into a higher speed/frequency output signal, which is fed back into the phase/frequency detector through the divider. The divider takes the higher speed frequency and divides it down for comparison to the reference signal by the phase/frequency detector.

As recognized by the present inventors, it is desirable to reduce the lock time for PLLs in certain applications, such as frequency synthesizers. For example, when frequency hopping is used in modern wireless networks (for example, 3G cellular, WCDMA, WLAN, and Bluetooth), the time to settle is considered "dead time" where no information is transmitted, and thus time is wasted. Speeding up the lock time increases the effective data rate and thus the value of such networks. Another example would be in wireline networks, where a reduced lock time helps to minimize the amount of data lost. That is, if a long string of zeros or ones is in the data path and the PLL loses lock, reacquiring lock sooner results in more data recovered.

A conventional way to speed up a PLL 20 is shown in FIG. 2 and includes a second charge-pump (CP) 32, or extra current sources, in parallel with a first charge pump 28 but with more current. This additional source 32 of current helps charge or discharge the main capacitor, or loop filter capacitor, faster and thus increases the loop bandwidth. However, since this changes the loop dynamics, the PLL 20 may more easily become unstable and oscillate. Conventional attempts to restore stability, such as switching in resistors to reduce the loop bandwidth, change the loop dynamics themselves and further add to the settling time of the PLL. Stability is therefore a major disadvantage of using conventional PLL speed-up techniques.

Additionally, conventional techniques to speed up PLL lock time may require some method of determining when the PLL is locked so that the added charge pump or current source can be disconnected for final lock, such as lock-detector circuitry. This adds cost and complexity to the design, and is an additional disadvantage of conventional techniques to speed up PLL lock times.

Furthermore, conventional techniques to speed up PLL lock times do not prevent frequency runaway of the locked PLL. Frequency runaway occurs when a locked PLL comes out of lock and cannot re-acquire lock.

As recognized by the present inventors, what is needed is a circuit and method for reducing the lock-time of a phase lock loop circuit without changing the feedback loop characteristics.

It is against this background that various embodiments of the present invention were developed.

SUMMARY

In light of the above and according to one broad aspect of one embodiment of the present invention, disclosed herein is an improved phase lock loop (PLL) which reduces the lock-time of a PLL and inhibits frequency runaway. In one example, a circuit includes a phase lock loop including a voltage controlled oscillator (VCO) having an input; and a lock aid circuit or circuits coupled with the input of the voltage controlled oscillator. In one example, the lock aid circuit is coupled with the input of the VCO directly, and in another example, the lock aid circuit is coupled with the input of the VCO through a circuit element (i.e., a resistor) or the lock aid circuit is coupled with the input of the VCO via the voltage across circuit element (i.e., a capacitor). Preferably, the lock aid circuit is not connected in the feedback loop of the phase lock loop circuit, and therefore the lock aid circuit does not change the feedback loop characteristics.

In one example, the lock aid circuit includes a Schmitt trigger having an output; a switch having an output and an input, the input of the switch is coupled with the output of the Schmitt trigger; and a voltage controlled current source coupled with the output of the switch and coupled with the input of the voltage controlled oscillator.

In one embodiment, the switch is a n-channel MOSFET and the Schmitt trigger is implemented using an amplifier such as an op-amp. The voltage controlled current source may include includes a pull-down output stage to pull the input signal present at the VCO down to ground or other reference level, or in another embodiment, the voltage controlled current source includes a pull-up output stage to pull the input signal present at the VCO up to a supply level such as VDD or other reference level.

In another embodiment, the lock aid circuit provides both a pull-down output stage to pull the input signal present at the VCO down to ground or other reference level, and a pull-up output stage to pull the input signal present at the VCO up to a supply level such as VDD or other reference level.

In another embodiment, the circuit may include a second lock aid circuit coupled with the input of the voltage controlled oscillator, and the second lock aid circuit may provide complementary functionality as the first lock aid circuit.

According to another broad aspect of another embodiment of the present invention, disclosed herein is a circuit including a phase lock loop circuit including a voltage controlled oscillator having an input; a first circuit portion coupled with the input of the voltage controlled oscillator, the first portion for pulling the input of the voltage controlled oscillator down to a ground reference potential; and a second circuit portion coupled with the input of the voltage controlled oscillator, the second circuit portion for pulling the input of the voltage controlled oscillator up to a supply reference potential.

In one example, the first circuit portion includes a Schmitt trigger having an output; a switch having an output and an input, the input of the switch is coupled with the output of the Schmitt trigger; and a voltage controlled current source coupled with the output of the switch and coupled with the input of the voltage controlled oscillator.

The second circuit portion may include a Schmitt trigger having an output; a switch having an output and an input, the input of the switch is coupled with the output of the Schmitt trigger; and a voltage controlled current source coupled with the output of the switch and coupled with the input of the voltage controlled oscillator.

According to another broad aspect of another embodiment of the present invention, disclosed herein is a method for reducing lock time of a phase locked loop having a voltage controlled oscillator. In one embodiment, the method includes comparing an input voltage of the voltage controlled oscillator to a desired value, and reducing the input voltage if the input voltage exceeds the desired value. In another example, the method may include comparing the input voltage of the voltage controlled oscillator to a second desired value, and increasing the input voltage if the input voltage is below the second desired value.

The features, utilities and advantages of the various embodiments of the invention will be apparent from the following more particular description of embodiments of the invention as illustrated in the accompanying drawings.

DETAILED DESCRIPTION

In accordance with embodiments of the present invention, lock aid circuits or portions thereof are coupled with conventional phase lock loops to reduce the lock-time of the phase locked loop. Further, embodiments of the present invention can inhibit frequency runaway, thereby keeping the phase lock loop in-lock. Preferably, the lock aid circuit is not connected in the feedback loop of the phase lock loop circuit, and therefore the lock aid circuit does not change the feedback loop characteristics.

The lock aid circuit may include a first portion for pulling the input of the voltage controlled oscillator down to a ground reference or like potential; and a second circuit portion coupled with the input of the voltage controlled oscillator, the second circuit portion for pulling the input of the voltage controlled oscillator up to a supply reference potential or the like. In this way, the lock aid circuit reduce the lock-time of the phase locked loop and can inhibit frequency runaway, thereby keeping the phase lock loop in-lock. Various embodiments of the present invention will now be described.

Figure 1:
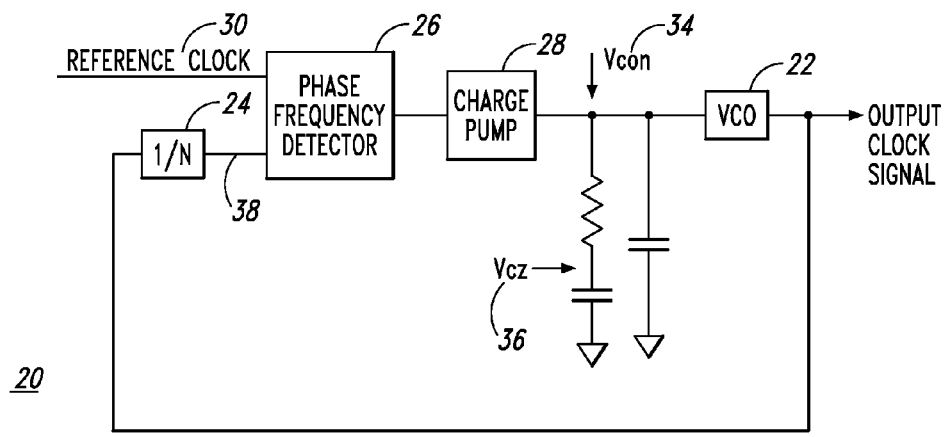
FIG. 1 illustrates a block diagram of a conventional phase locked loop.
Figure 2:
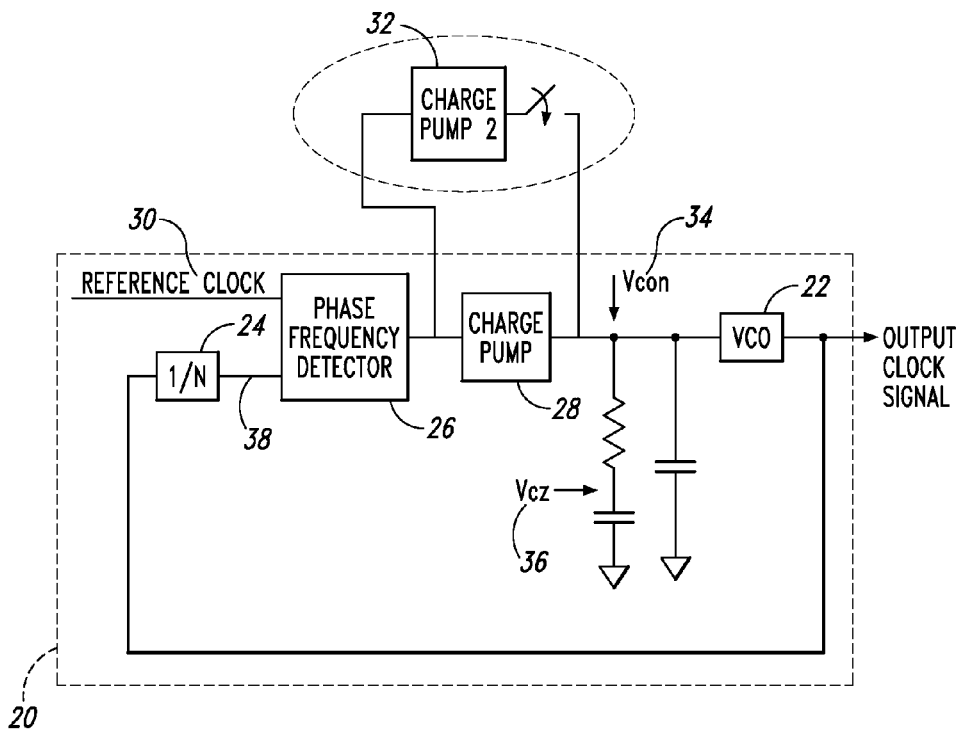
FIG. 2 illustrates a block diagram of a conventional phase locked loop for reducing PLL lock time.
Figure 3:
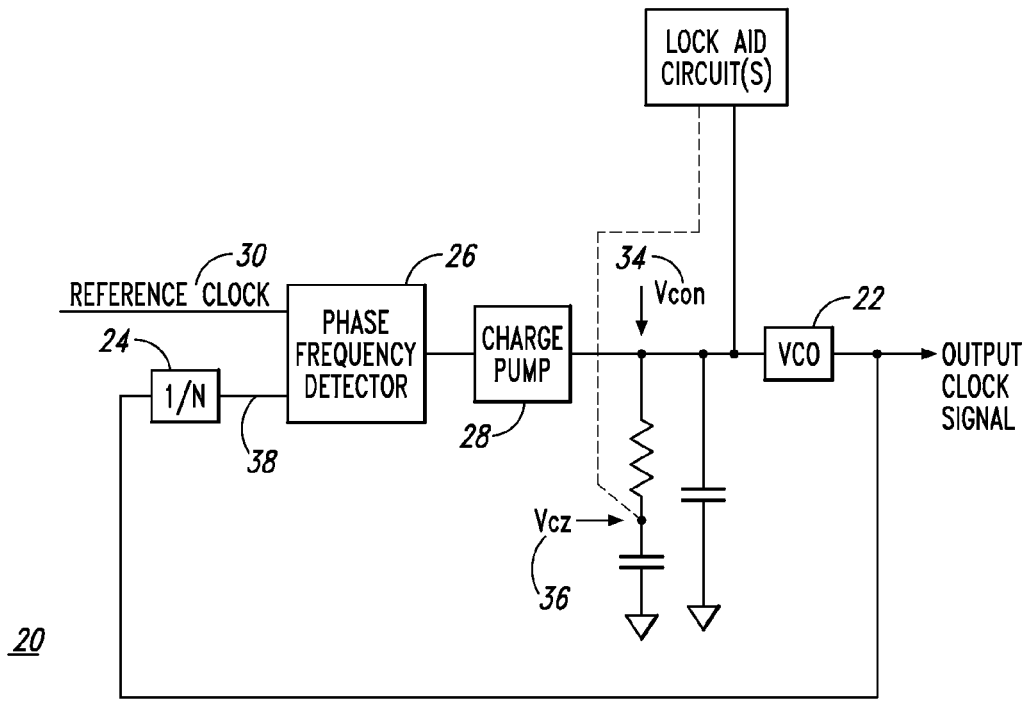
FIG. 3 illustrates a block diagram of an example of a phase locked loop with a pair of lock aids, in accordance with an embodiment of the present invention.

FIGS. 3-6 illustrates various examples of embodiments of the present invention. In FIG. 3, lock aid circuit(s) are coupled with a conventional phase lock loop circuit. Various examples of the lock aid circuit are described herein. In one example, the lock aid circuit is coupled with the input of the VCO directly, and in another example, the lock aid circuit is coupled with the input of the VCO through a circuit element (i.e., a resistor) or the lock aid circuit is coupled with the input of the VCO via the voltage across circuit element (i.e., a capacitor).

In FIG. 3, the PLL architecture contains nodes labeled Vcon (voltage control node) and Vcz (capacitor-zero node). In one example, lock aid circuit is coupled with the Vcon node, and in another example, the lock aid circuits are coupled with the Vcz node or elsewhere in the PLL. Preferably, the lock aid circuit is not connected in the feedback loop of the phase lock loop circuit, and therefore the lock aid circuit does not change the feedback loop characteristics.

Figure 4:
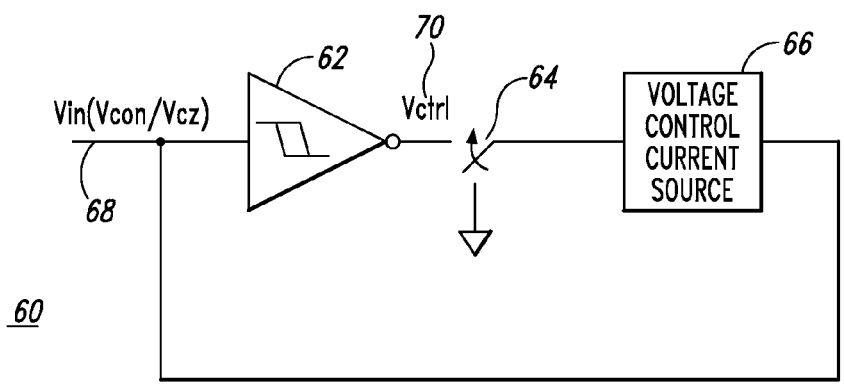
FIG. 4 is block diagram of an example of a lock-aid including a Schmitt trigger, a switch, and a voltage controlled current source, in accordance with an embodiment of the present invention.

FIG. 4 illustrates an embodiment of a lock aid circuit that attaches to a conventional phase lock loop circuit (for example, to conventional PLL circuit of FIG. 3). In one example, the lock-aid circuit includes an input voltage (such as Vcon or Vcz of FIG. 3), a Schmitt trigger providing a control voltage (node labeled Vctrl (see also FIG. 7)), a switch, and a voltage-controlled current source.

In one example, the Schmitt trigger receives an input voltage such as VCON or VCZ and the output of Schmitt trigger 62 is coupled to a switch 64 which selectively couples the output of Schmitt trigger 62 with the input of a voltage controlled current source 66. The voltage controlled current source 66 has its output coupled with the input of the Schmitt trigger 62 and to the Vcon or Vcz nodes.

The lock aid circuit works by providing additional current, through the voltage controlled current source, to the Vcon or Vcz node, until Vcon falls within some specified voltage range controlled by the Schmitt trigger. If the Vcon or Vcz voltage again falls outside this specified range, then additional current is again supplied to bring the Vcon or Vcz node back inside the window specified by the Schmitt trigger circuit. The switch is present to disable the lock aid circuitry.

Figure 5:
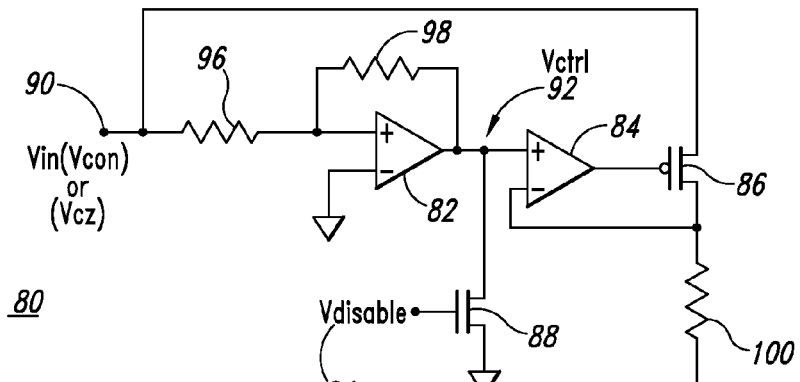
FIG. 5 is an example circuit for a lock aid of FIG. 4, in accordance with one embodiment of the present invention.

FIG. 5 shows one possible circuit implementation of the lock aid circuit of FIG. 3. In this example, amplifier 82 has its output coupled with an input of amplifier 84. The output of amplifier 84 is coupled with the gate of P-channel transistor 86. The input of amplifier 84 (shown as the Vctrl signal 92) is coupled with the drain of N-channel transistor 88 which has its source coupled with ground and its gate controlled the V signal 94 V-disable. The input signal VIN (shown as VCON) 90 is coupled with the input of amplifier 82 through resistor 96, and resistor 98 coupled the output of amplifier 82 to the input of amplifier 82. The non-inverting input of amplifier 82 is coupled with ground. Amplifier 84 has its non-inverting input coupled with ground through resistor 100, which is also coupled with the drain of P-channel transistor 86.

The first operational amplifier 82 is used to create a conventional Schmitt trigger, which defines a hysterisis window that can be set by the ratio of resistors 96, 98. The second op-amp 84 performs the function of a voltage-controlled current source. The voltage at Vctrl is converted to a current that is supplied to the Vcon or Vcz node, resulting in a fast lock time and frequency runaway prevention. Vdisable disconnects the lock-aid circuit when set high. In the example of the lock aid circuit of FIG. 5, a pull-down output stage is formed by p-channel FET 86 and resistor 100 which can pull the Vcon or Vcz signal down to a low potential as determined by resistor 100, such as near ground or other such low potential.

Figure 6:
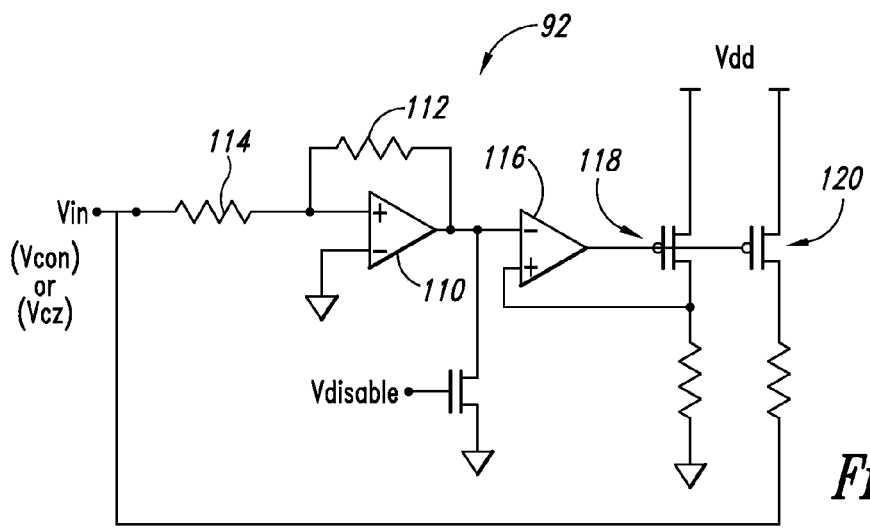
FIG. 6 is another example circuit for a lock aid of FIG. 4, in accordance with one embodiment of the present invention.

FIG. 6 shows another possible circuit implementation of the lock aid circuit of FIG. 3. The operational amplifier 110 is used to create a conventional Schmitt trigger, which defines a hysterisis window that can be set by the ratio of resistors 112, 114. The second op-amp 116 performs the function of a voltage-controlled current source. Vdisable disconnects the lock-aid circuit when set high. In the example of the lock aid circuit of FIG. 6, a pull-up output stage is formed by p-channel FETs 118, 120 and resistor which can pull the Vcon or Vcz signal up to a high potential as determined by resistor, such as near Vdd or other such high potential.

In one example, a lock aid circuit can include both a circuit such as the example of FIG. 5 for regulating the upper limits of the signals Vcon or Vcz, and a circuit such as the example of FIG. 6 for regulating the lower limits of the signals Vcon or Vcz. In such an implementation, the set point of the circuit of FIG. 5 can be set to trigger at a target voltage plus some margin (shown in FIG. 7 as "+Δ V"), and the set point of the circuit of FIG. 6 can be set to trigger at a target voltage minus some margin (shown in FIG. 7 as "−Δ V").

In one example, the circuits of FIGS. 5-6 can both be connected to the Vcon node in FIG. 3, or can both be connected to the Vcz node in FIG. 3.

Figure 7:
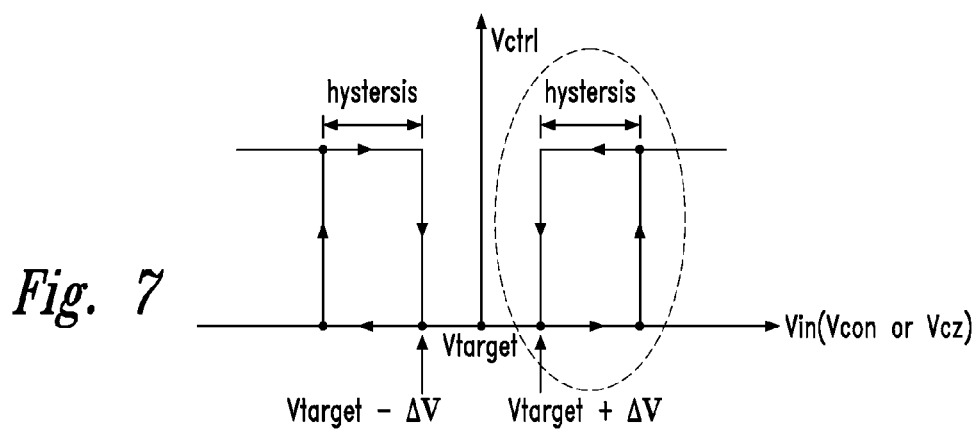
FIG. 7 is graph of input and control voltages of two lock-aid circuits in parallel, each one contributing one hysterisis, in accordance with one embodiment of the present invention.

As shown in FIG. 7, the lock aid circuit operates by constraining the VCO control-voltage node Vcon or Vcz to within some window (defined at design, in one exemplary embodiment, this window may be 100 mV) of a target voltage, Vtarget.

When enabled, the lock-aid circuit of FIG. 5 or 6 is connected to the Vcon or Vcz node in FIG. 3, and when the PLL is out of lock, the lock aid circuitry adds or subtracts current supplied to the loop filter capacitors such that the time required to lock is minimized. Once the VCO control node (Vcon) potential falls within delta V of the desired Vtarget, the lock aid turns off and the PLL pulls itself into final lock. In one example, delta V is a value set at design and should be less than half the total constraining window, with a default value that may be set to one quarter of this window.

However, if the PLL VCO control voltage (node Vcon, either during final lock or due to drift or runaway) changes more than delta V plus the hysterisis away from Vtarget, the lock aid turns back on. Current is either added or subtracted to the control voltage node (Vcon) to bring the loop back into lock. The hysterisis is present to prevent artificial oscillations at what would have been the lower and upper lock aid boundaries if hysterisis were not present. A switch, controlled by Vdisable, is provided if the lock aid is desired to be disabled.

An example of how the fast-locking PLL has an advantage over a conventional PLL locking process is illustrated as follows. In one example for illustration only, it is assumed that a PLL has a loop-filter capacitor of 800 pF, a target Vcon voltage of 400 mV, and a charge pump that supplies a current of 20 uA during lock. Using the expression $C=Q/V$, and $I=Q/T$, the capacitance can be expressed as $C=I \times T/V$. Solving for time, $T=C \times V/I$, which is the time it takes to charge capacitor C to voltage V with current I. If this example lock aid supplies 1 mA current, then this is 50 times larger than the PLL's charge pump current of 20 uA. Thus, the lock aid speeds up the time it takes to charge the capacitor by a factor of 50 times (i.e. 1 mA/20 uA). Lock time is therefore reduced, which is desirable. Once locked, if the PLL comes out of lock, then the Schmit trigger flips state so that current can be added to acquire re-lock, thereby preventing frequency runaway.

In an alternate embodiment, the lock aid circuitry can be tied to Vcz, or both Vcz and Vcon nodes, as labeled in FIG. 3.

Advantages of the lock aid of embodiments of the present invention over conventional techniques to reduce PLL lock time are that the loop stability remains as originally designed, and that PLL frequency runaway is prevented on both sides, high and low.

While FIG. 3 illustrates a particular implementation of a phase locked loop, it is understood that embodiments of the present invention may be used with other designs or implementations of phase locked loops including any conventional phase locked loops.

While embodiments of the invention have been described with reference to a VCO, other types of oscillators may be used in place of or in addition to a VCO, such as variable frequency oscillators (VFO), current controlled oscillators, or any other type of conventional oscillator.

Embodiments of the present invention may be used in various semiconductors, memories, processors, controllers, integrated circuits, logic or programmable logic, clock circuits, communications devices, and the like.

As used herein, the term "transistor" or "switch" includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included, if desired, in at least one embodiment of the present invention. Therefore, it should be appreciated that two or more references to "an embodiment" or "one embodiment" or "an alternative embodiment" or "one example" or "an example" in various portions of this specification are not necessarily all referring to the same embodiment. Furthermore, the particular features, structures or characteristics may be combined as desired in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to embodiments thereof, it will be understood by those skilled in the art that various other changes in the form and details may be made without departing from the spirit and scope of the invention.

What is claimed is:

1. A circuit, comprising:
    a phase loop circuit including a voltage controlled oscillator having an input; and
    a lock aid circuit coupled with the input of the voltage controlled oscillator, wherein the lock aid circuit includes:
        a first amplifier configured as a Schmitt trigger having an output and an input;
        a first switch having an output and an input and a control;
        a second amplifier having an input coupled with the output of the first amplifier, the second amplifier having an output coupled with the control of the switch;
        the input of the switch being coupled with the input of the voltage controlled oscillator, and the output of the switch being coupled with ground; and
        a second switch having an output and an input and a control, the input of the second switch is coupled with the output of the first amplifier, the output of the second switch is coupled with ground, and the control of the second switch is coupled with a voltage signal to disable the lock aid circuit.

2. The circuit of claim 1, wherein the switch is a p-channel MOSFET.

3. The circuit of claim 1, wherein the second switch is a n-channel MOSFET.

* * * * *